United States Patent [19]

Sankhagowit

[11] Patent Number: 4,801,561
[45] Date of Patent: Jan. 31, 1989

[54] METHOD FOR MAKING A PRE-TESTABLE SEMICONDUCTOR DIE PACKAGE

[75] Inventor: Thanomsak Sankhagowit, San Jose, Calif.

[73] Assignee: National Semiconductor Corporation, Santa Clara, Calif.

[21] Appl. No.: 63,356

[22] Filed: Jun. 18, 1987

Related U.S. Application Data

[62] Division of Ser. No. 628,106, Jul. 5, 1984, Pat. No. 4,701,781.

[51] Int. Cl.$^4$ .......................... H01L 5/00; H01L 23/48
[52] U.S. Cl. .......................... 437/207; 437/8; 29/835; 29/841; 29/741; 29/593; 264/272.11; 264/272.15; 174/52.2; 174/52.4
[58] Field of Search .................. 437/209, 8, 207, 206; 29/839, 835, 841; 357/72, 70, 74, 68; 174/52 FP, 52 PE; 264/272.11, 272.15

[56] References Cited

U.S. PATENT DOCUMENTS

| | | | |
|---|---|---|---|
| 3,444,440 | 5/1969 | Bell et al. | 357/70 |
| 3,611,061 | 10/1971 | Segerson | 357/70 |
| 3,689,991 | 9/1972 | Aird | 437/207 |
| 3,838,984 | 10/1974 | Crane et al. | 357/68 |
| 4,132,856 | 1/1979 | Hutchison et al. | 437/209 |
| 4,380,042 | 3/1983 | Angelucci, Sr. et al. | 29/839 |
| 4,499,333 | 2/1985 | Chee et al. | 357/72 |
| 4,630,096 | 12/1986 | Drye et al. | 357/74 |
| 4,649,415 | 3/1987 | Hebert | 357/72 |

Primary Examiner—Brian E. Hearn
Assistant Examiner—Beverly Ann Pawlikowski
Attorney, Agent, or Firm—Lee Patch; Gail W. Woodward; Mark Aaker

[57] ABSTRACT

An encapsulated die package (20) is shown in which a semiconductor die is connected in a die-attach aperture of a copper foil tape (11). Die contact pads (31) are bonded to the inner ends (31a) of interconnected finger contacts (13) on the tape. Finger contacts etched in the foil include splayed out portions (15) extending to probe ends (19). Interconnect cross-links (16) initially connect the finger contacts and the tape edges and function as dam bars in subsequent encapsulation steps. The die and die bonds are mold encapsulated to form the die package (20) and a carrier frame (17) is simultaneously molded around and spaced from the periphery of package (20). The probe ends are exposed within a slot (34) in the frame or extend from the ends of the frame so that probe tips can be pressed thereon to test the die and its bonds. Prior to testing, the interconnects exposed in the annulus between the package and the carrier are blanked out so that each finger leading from a die contact pad becomes discrete, i.e. is no longer interconnected to an adjoining finger, so that testing of each die contact and bond can be done. The stiff molded carrier acts to support the probe ends of the fingers and protects and stiffens the foil tape for the testing operations and for shipping and handling purposes.

9 Claims, 2 Drawing Sheets

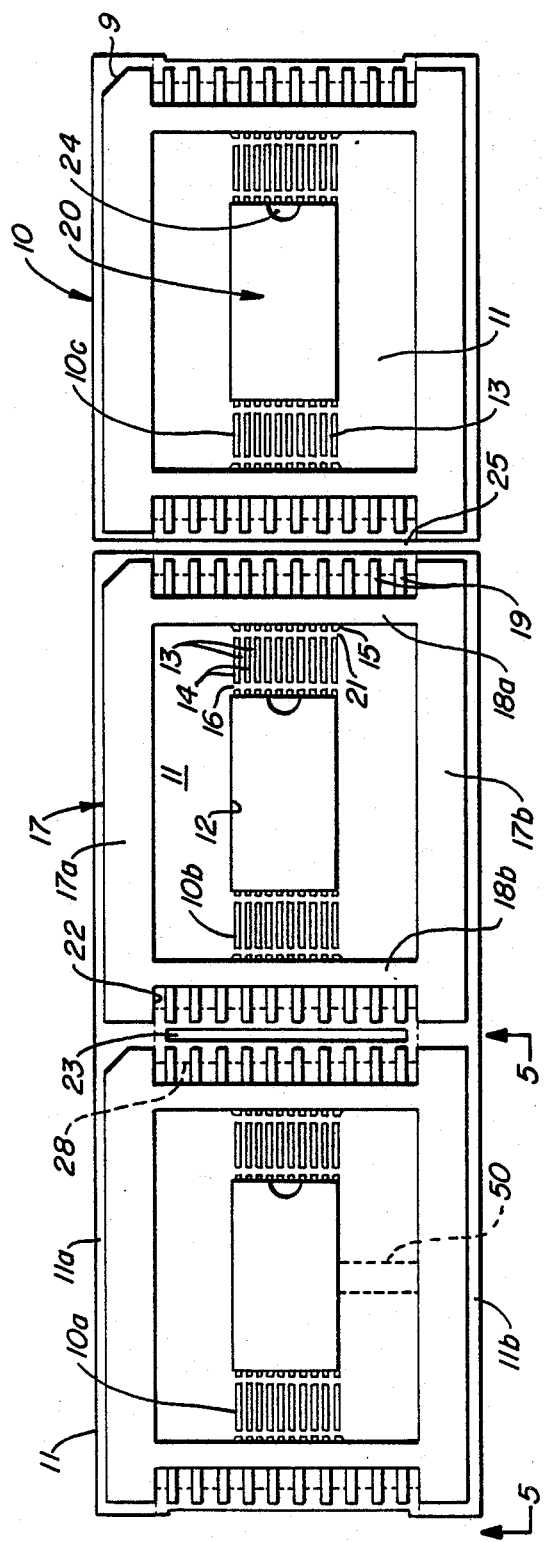
FIG._1.
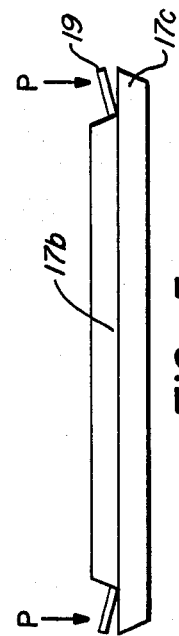
FIG._5.
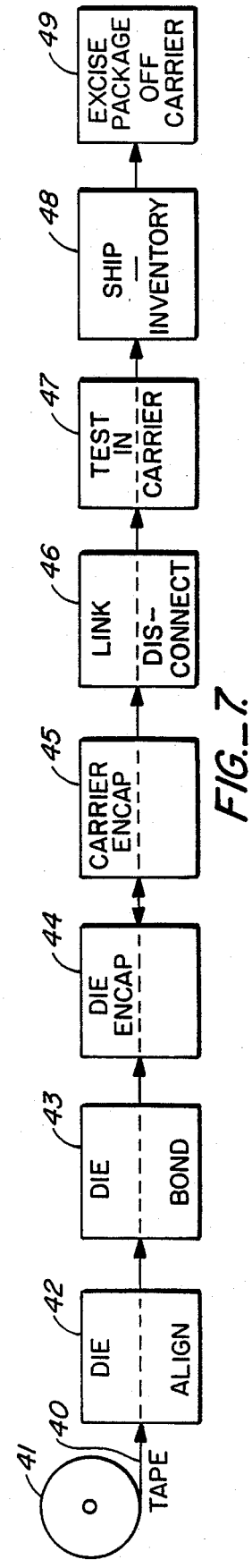
FIG._7.

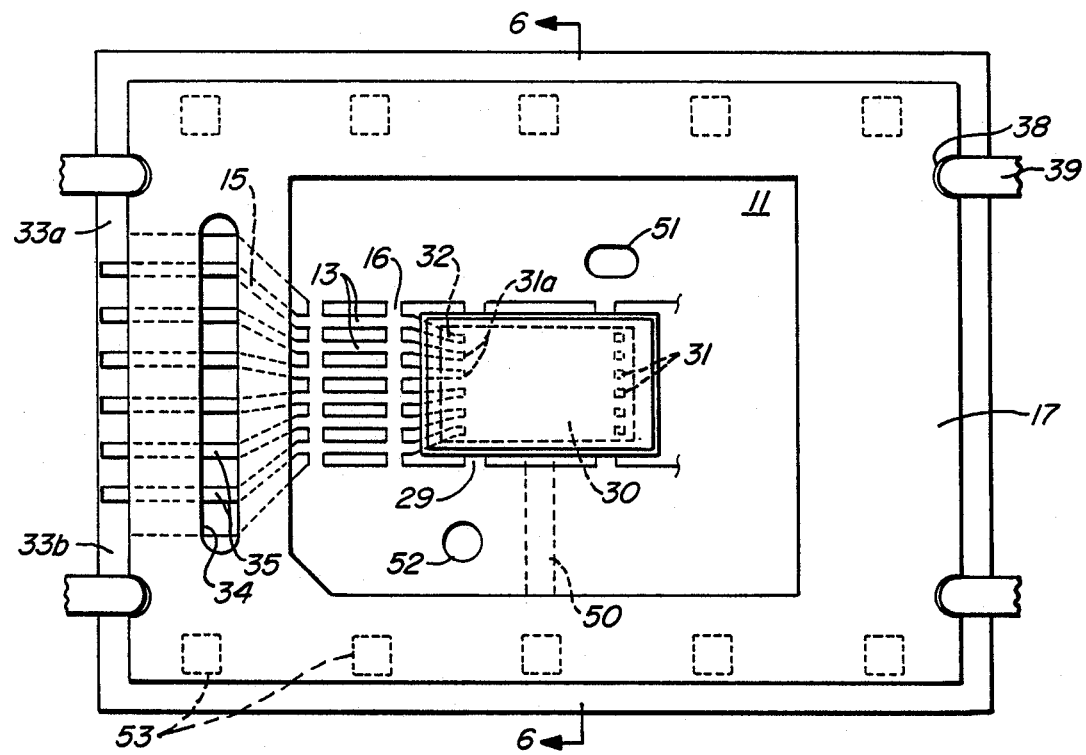
FIG._2.
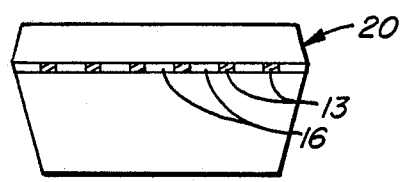
FIG._3.
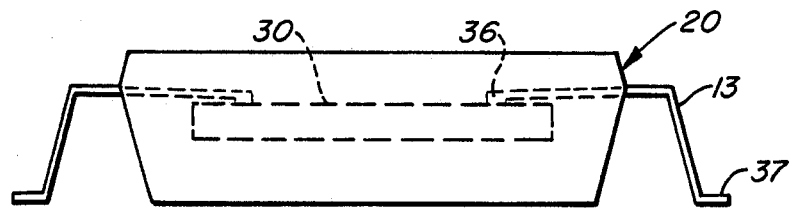
FIG._4.
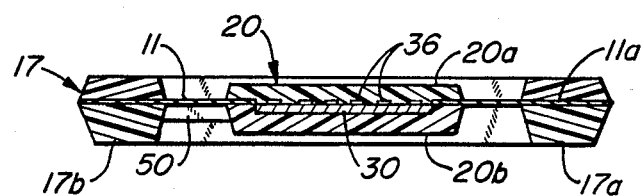
FIG._6.

METHOD FOR MAKING A PRE-TESTABLE SEMICONDUCTOR DIE PACKAGE

This is a divisional of application Ser. No. 628,106, filed on July 5, 1984, now U.S. Pat. No. 4,701,781, issued Oct. 20, 1987.

BACKGROUND OF THE INVENTION

1. Field of the Invention

The present invention relates to a tape automated bonding process for fabrication of packaged integrated circuit semiconductor devices or IC dies and to lead frame and package constructions resultant from such processes.

2. Prior Art

Semiconductor chips or integrated circuit (IC) dies have multiple electrical contact pads which are connected through external electrical leads or thin film conductors to plug-in contacts or bonded to other members on a printed circuit board or the like. In production processes, tape automated bonding (TAB) has been employed where a strip of metal tape in reel form provides a plurality of groups of metallic parts where each group includes interconneted finger contacts. These are connected at inner beam ends to die contact pads by bonding wires, compression bonding, or other means. The outer ends of finger contacts form the plug-in contacts or other connectible contacts of the die package.

This technique is typified by the method and construction shown in U.S. Pat. No. 3,611,061 where a continuous metal tape has arrays of duplicate metal pathways forming narrow parallel finger contacts extending from a die-connect end to an integral metal transverse stabilizer for which holds the frame while the IC die is being bonded and encapsulated. The somewhat flexible metal tape, which is of a thickness from about 2.3 to 2.9 mils, has interconnect links between the finger contacts and sprocket hole perforations on the outer edges for indexing and moving the tape through fabrication stations. After the die, inner ends and the die-to-ends bonds are encapsulated the links are sheared and the stabilizer bar and outer tape edges trimmed off resulting in a typical DIP (dual-in-line) or other package with finger-type plug-in leads extending from each side of the package. The device is then ready for testing.

U.S. Pat. No. 3,689,991 shows a two-layer tape wherein sets of finger-like leads are secured or formed by etching techniques on an insulative tape. These leads are essentially thin copper foils with a thickness of from about 1.0 to 1.6 mils. Such insulative tape affords support for the thin leads during the die bonding and encapsulation process and partly remains part of the internal final assembly. Three-layer tape has also been employed which is similar to the two-layer tape described above except that the thin copper foil is laminated typically to a polymide layer previously coated with an adhesive material. It has been known to test two-layer and three-layer encapsulated packages prior to their complete trimming from the tape. This has been possible since the film is originally supported and continues to be supported in the fabrication process by the insulative layer. U.S. Pat. No. 3,444,440 also shows a metal lead frame for mounting an IC die albeit not in reel form. After die bonding and encapsulation, the "picture-frame" edges (FIGS. 5-8) are trimmed off and the final package is ready for test. U.S. Pat. No. 4,234,666 shows TAB processing of thin, delicate copper foil including inner and outer gang bonding of the leads to the die and lead frame, respectively.

Honeywell Corporation has utilized a two-layer polyimide/ copper tape in which an array of contact fingers and die attach area are mounted into a prefabricated stiff plastic frame akin to a 35 mm film negative holder and the die bonded to inner contact fingers. The die and the bonds are then tested after blanking of interconnects but before encapsulation of the die and the bonds.

SUMMARY OF THE INVENTION

The improved TAB technology of this invention offers advantages over the prior art in that it allows use of thin single-layer metal foil tape which is less costly, of high reliability, can be employed in extremely small packages, is easier to process and permits pre-testing of encapsulated packages prior to the die package being completed. Tape procurement, bonding components and dies are very expensive components of the overall cost. An automated process in which each of the dies (and their connections to the lead frame) can be pretested before other operations are performed on the package and the final package connected to its printed circuit board or to a die module or shipped to a using customer is therefore advantageous. This is particularly evident in the single packaging of multiple dice where high reliability and yield are essential. For example in a single-in-line memory module consisting of nine 64K bit DRAM dice which dice are mounted on a multilayered ceramic substrate and then gold-bonded, reliability testing cannot be performed prior to assembling on a printed circuit board. The probability of having all nine dice functioning within specifications is quite low. With the present invention, each die after it has been tape bonded and encapsulated can be pretested on the tape and if deficient can be eliminated from further processing and use. Thus, with pre-testing on the tape only one malfunctioning die may be eliminated rather than, if only one die is bad, necessitating the sacrifice of all nine dice, including eight satisfactory ones, making up the total module.

Use of single layer metal foil tape heretofore has not had the capability of being pre-testable. The thin foil tape is very flexible and flimsy. It must be kept intact i.e., the leads kept interconnected and shorted together, until the final bonding and trimming operations. Trying to pretest after separation of the connecting links is extremely difficult since the package is so small, the spacing between the fingers is correspondingly small and the leads are too flimsy to handle or probe without breakage or shorting out to an adjacent lead.

The above advantages are gained by providing a one-layer metal foil lead frame tape, generally supplied from a tape reel and containing edge sprocket holes for indexing. The tape has finger contacts including inner end beams bonded to die contact pads and outer splayed probe ends suitable for test probe sites with intermediate parallel portions interconnected by cross links. The die, die contact pads, inner beam ends and their connection are then encapsulated to form a package having intermediate portions of the foil finger contacts and cross-links extending from the package. An insulative carrier is preferably simultaneously molded at least tranversely across the splayed probe ends and the cross-links sheared to form discrete nonshorted finger contacts extending from the die bond to the probe ends. Each package die can be tested in its carrier by probes contacting the discrete probe ends. Provision of a temporary molded-in-place insulative carrier across the splayed probe ends of the lead frame finger contacts permits rigidity and fixed spacing of the foil leads for the pre-test operation. After pretesting and if immediate connection to a printed circuit board is desired, the insulative carrier and the perforated edge portions of the tape are trimmed off the assembly (package/carrier unit) leaving a tested molded package with extending foil tabs or contacts for bonding to a module or printed circuit board electrical pathway. In the case of multidie applications, for example, the described nine dice memory module, a die can be pretested by a suitable probe set after burn-in while it is still on the carrier so that if a malfunction occurs the bad die can be identified and thrown away. A subsequent encapsulated die package/carrier unit is tested for substitution. Thus, a group of dice may be individually pretested before their insertion in an expensive overall memory device. Further, the packaged die may be left in its carrier for internal handling in inventory or shipment to a customer. The package/carrier units may be stacked for slipping or storage purposes without injury to the die package since the carrier acts as a protective frame completely around the die package. The die package and integral carrier can be again tested if desired by the customer before the die (with the carrier trimmed off) is placed and bonded to the customer's printed circuit board.

BRIEF DESCRIPTION OF THE DRAWINGS

FIG. 1 is a top plan view of the preferred tape automated bonding construction prior to initial trimming for test purposes.

FIG. 2 is a partial top plan view of a second embodiment of the invention.

FIG. 3 is a magnified end view of the die package after encapsulation.

FIG. 4 is a magnified side view of the die package after testing and final trimming to form a gull-wing die package mount.

FIG. 5 is a side view of the finished carrier taken generally on the line 5—5 of FIG. 1 with the tips of the carrier edge legs beyond the transverse carrier legs being absent.

FIG. 6 is a cross-sectional end view of the finished carrier taken generally on the line 6—6 of FIG. 2.

FIG. 7 is a schematic view of the major steps of the fabrication process.

As shown in FIG. 1 the tape automated bonding construction 10 comprises a single layer thin copper foil tape 11 typically of 2.6 mils in thickness and weight of two ounces per square foot which may be supplied as a continuous flexible strip from a reel. The strip has continuous repeating linear arrays 10a, 10b, 10c, etc. of similar patterns. These are normally fabricated by printing, masking and etching techniques, as is known in the semiconductor processing field. Each individual array at this stage includes a series of multiple initially-interconnected finger contacts 13 having cutout etched apertures 14 therebetween. Etched cutouts separate the outermost fingers from the outer edges of the foil. The contacts are interconnected to each other and the outer longitudinal edges of the tape by longitudinal and laterally spaced, integral cross-links 16 which also function as dam bars to prevent egress of encapsulant between the finger contacts. The finger contacts or pathways 13 in a particular application are on 20 mil centers and are 10 mils wide with a 10 mil spacing between the fingers. Links and dams are thus also 10 mils in length between the contacts.

A die-receiving area 12 is provided centrally of each pattern in the illustrated embodiment. A semiconductor die such as a random access memory unit or other device is positioned in a tape central aperture and contact pads on the die bonded to inner end beams 31 (shown in detail in FIG. 2) of the finger contacts 13. Splayed-out pathways 15 extend in electrical connection outwardly from finger contacts 13 to outer probe ends 19. The attached die, and the inner end beams and the bond therebetween are encapsulated to form a molded plastic die package 20 thereround. Simultaneously a peripheral insulative plastic carrier 17 is molded on both sides of the film. The carrier comprises longitudinal edge legs 17a and 17b and connected transverse legs 18a and 18b surrounding and spaced from the die package 20 to form a relatively stiff frame. Finger contacts 13 extend in parallelism across longitudinal portions of the annulus between the package and carrier with the fingers and cross-links exposed.

The package and carrier are transfer molded in molded platens brought into registration with those portions on the top and bottom surfaces of the tape where the package 20 and carrier 17 are to be formed. The encapsulant may be any suitable insulative molding compound, for example, an epoxy resin such as Sumitomo 1100, available from the Sumitomo Corporation. This particular encapsulant is used at a molding temperature of about 170° C. with the transfer of compound occurring in about 12 seconds and with a cure time of about 70 seconds. A Stokes 40-ton press may be utilized to provide a high pressure molding operation. Encapsulation of multiple, for example, eight packages and eight surrounding carriers, may be done simultaneously at each indexing of the tape. A mold gate 50 extends from the carrier mold to the package mold so both molds can be served from a common molding compound source.

In a typical memory module application a die aperture of 19×35 mm is etched in the foil and a die (integrated circuit chip) of 0.157×0.259 inches bonded to the finger contacts. The probe ends 19 of the pattern are splayed out from the intermediate contact fingers 13 by angular patterns 15. Probe ends 19 are preferably 20 mils wide and are on 50 mil centers thus allowing probe sensing utilizing a spring-pressed, collet-type pin probe tester (known in the art as a POGO tester).

After encapsulation and curing of the package(s) and surrounding carrier(s) the cross-links 16 and links 21 connecting the outermost fingers to the tape edges are blanked out to make each finger contact discrete, i.e., the interconnections or shorts between the fingers are removed. The probe finger ends 19 extend in an end slot 22 in carrier 17 or to the end of transverse legs 18a and 18b. At this time the film is excised, i.e. apertured at 25, to split-off one array from the next in line and to separate the probe ends 19 from each other. The tape 11 has a transverse aperture 23 between the arrays for stress relief in the molding operation. A semi-circular detent 24 is provided on the package top for determining package orientation in downstream test or assembly fixtures. Bevelled edge 9 on frame 17 also functions to orient the package for testing.

FIG. 2 illustrates an alternative embodiment of the invention and in addition a more detailed view of a typical die bonding construction. An inboard ovoidal slot 34 is molded within carrier 17 so as to provide access of probe tips to probe portions 35 extending from the contact fingers 13 and splayed pathways 15. The carrier may extend over sprocket holes 53 in the foil (used for indexing the foil through the die bonding and encapsulating steps) and end short of the tape edges 11a and 11b, as in FIG. 1. It may alternatively extend in the preferred mode around the foil edges as is shown in FIG. 6

Die 30 has contact pads 31 which are bonded by reflow soldering, compression bonding or the like to the tips 31a of pathways or beam ends 32 of finger contacts 13. Registration notches 38 may be included in the foil and carrier for registration with tooling pins 39 to accurately locate the carrier and package for blinking and probe operations. Indexing holes 51 and mold locating holes 52 may be included in the film 11. Edge portions 33a and 33b and the area between the contact fingers outer ends are also excised to form the discrete contact fingers after encapsulation of the package and formation of the carrier has been completed.

FIG. 3 is a magnified end view of the molded package 20 showing tapered upper and lower case edges which aid in pin ejection of the package and carrier from the mold platens. The dam bar function of cross links 16 between the fingers 13 is also more clearly seen, such bars preventing ejection of encapsulant from the mold between the fingers. For better viewing the contact fingers have been omitted from the right side of die 30 in FIG. 2 although shown in FIG. 3.

FIG. 4 is a magnified side view of the package after testing and trimming of the carrier therefrom and bending of the foil fingers 13 to form a gull-wing type mount 37. A copper bump 36 may be included on the inner beam ends of fingers 13 to facilitate thermocompression bonding with the die contact pads. The tips of the gull-wings 37 are bonded to bonding pads on copper or other conductive traces or through-hole vias, for example, on a printed circuit board. For test purposes the wings 37 are pushed down onto contacts of a test device.

FIG. 5 is a preferred embodiment of a package/carrier unit in which the tips of legs 17a and 17b of the carrier 17 extending beyond the connecting transverse legs 18a and 18b, are absent from the molded carrier. A pair of ledges 17c are formed extending across the molded frame at a level immediately below the bottom of the probe ends 19. Test probes P can be spring-pressed against the probe ends 19 and ledges 17c support the thin foil when the foil ends are being pressed.

FIG. 6 is a cross-sectional view of the finished package/carrier unit which shows the top surface 20a and bottom surface 20b of the central molded die package 20 below and above the respective top and bottom surfaces of frame 17. Thus the die package is recessed in a horizontal plane below the plane of the top and bottom surfaces of the carrier and protected from abrasion or contact with die/carrier units stacked one on another. The edges of the carrier are also tapered to facilitate its removal from the mold platens. The edges 11a of the foil tape are totally encompassed by the carrier in this embodiment so that the carrier has smooth outer edges for handling and no copper edges are exposed which may jam fixtures or processing machinery. A trim and form tool and die set is utilized to trim frame 17 and gate 50 from the package which will result in a typical package such as shown in FIG. 4 Normally, each of the package/carrier units or arrays shown in FIG. 1 are singleated for test purposes while the package is mounted in the carrier. The package/carrier unit 10 may be mounted in burn-in sockets and burn-in performed prior to testing of the die and its contact bonds.

FIG. 7 schematically illustrates the steps of the fabrication process. A continuous roll of tape 40 is indexed from a reel 41 to a die-align station 42 where a die(s) are aligned with die-apertures in the tape. The contact pads of the die are bonded in a die bonding step 43 to particular foil fingers of the tape. The die and die-to-finger bonds are encapsulated by molding step 44. Simultaneously, a carrier is encapsulated peripherally around and spaced from the die package by a molding step 45. The two-way arrows denote simultaneous steps which are preferred although the respective molding operations could be performed separately at more expense and inconvenience. After curing of the encapsulated die and die carrier the cross-links/dams are then blanked out in step 46 forming discrete (nonconnected) fingers supported at their root by the package encapsulation and at or adjacent their outer ends by the molded peripheral carrier. The package/carrier unit is then singleated and is ready for the burn-in and testing step 47. A group of connected units may also be individually tested. The resultant tested package/carrier unit may be sold in the carrier for subsequent trimming and use with or without retest by the customer. Alternatively, the package/carrier can be placed in inventory. Then as needed the package can be excised from the carrier, including removal of the molding gate between the carrier and die package, and mounted for its intended use on a printed circuit board or other electrical device.

While the invention has been described in terms of a dual ended type of device where leads extend from the ends of package it also may be utilized with single-in-line, dual-in-line and quad configurations, for example, where the leads extend from the longitudinal side(s) of the die package or from all four sides, respectively.

The above description of embodiments of this invention is intended to be illustrative and not limiting. Other embodiments of this invention will be obvious to those skilled in the art in view of the above disclosure.

I claim:

1. A method of fabricating a tapemounted semiconductor die package testable in-situ comprising:

providing a metal foil lead frame having multiple interconnected finger contacts extending from a die-receiving area, said contacts having inner beam ends, outer test ends and intermediate portions therebetween including cross-links connecting said finger contacts;

connecting contact pads of a semiconductor die to said inner beam ends;

molding a package-forming encapsulant around said die and said inner beam ends on said lead frame whereby said outer test ends and intermediate portions of said finger contacts extend outwardly from said encapsulant;

molding an insulative carrier over at least a transverse part of said outer test ends of said finger contacts while leaving said outer test ends exposed whereby electrical probe contact can be made to said finger contacts; and removing said cross-links from their location between said finger contacts whereby said outer test ends become electrically isolated and are accessible for probe testing individual ones of said finger contacts adjacent said carrier.

2. The method of claim 1 further comprising trimming away said carrier and all of said lead frame so as to leave said package with said intermediate portions of said finger contacts extending from said package-forming encapsulant to form said die package.

3. The method of claim 1 in which said metal lead frame is processed in the form of a metallic single-layer foil strip with a plurality of interconnected successive linear arrays of multiple interconnected parallel finger contacts and die-receiving areas and wherein said molding steps are simultaneously performed on said plurality of arrays in said strip.

4. The method of claim 3 including aligning a series of dies with respect to each of said arrays in said strip; and bonding a die to each of said arrays.

5. The method of claim 1 further comprising molding said carrier peripherally in the form of a ring around and spaced from said package-forming encapsulant, said transverse part extending between and providing backing for said outer test ends and lying outside said cross links which are thereby exposed in the region of said intermediate portions of said finger contacts.

6. The method of claim 1 further comprising daming an area of said insulative carrier during said molding step transverse of said finger contact outer test ends thereby to exclude a portion of said carrier and to form a probing slot that exposes said outer test ends of said fingers in said carrier transverse to said outer test ends.

7. The method of claim 1 wherein said die is connected to said inner beam ends by thermal compression gang bonding.

8. The method of claim 5 wherein said carrier ring is made thicker than said package-forming encapsulant whereby the molded carrier acts to protect said package during handling and testing.

9. The method of claim 5 wherein said carrier ring is molded simultaneously with said package-forming encapsulant.

* * * * *